United States Patent
Zhang et al.

(10) Patent No.: US 11,113,846 B2
(45) Date of Patent: Sep. 7, 2021

(54) COEFFICIENT CONTEXT MODELING IN VIDEO CODING

(71) Applicant: HULU, LLC, Santa Monica, CA (US)

(72) Inventors: Wenhao Zhang, Beijing (CN); Deliang Fu, Beijing (CN); Juncheng Ma, Beijing (CN); Chen Liu, Beijing (CN)

(73) Assignee: HULU, LLC, Santa Monica, CA (US)

( * ) Notice: Subject to any disclaimer, the term of this patent is extended or adjusted under 35 U.S.C. 154(b) by 99 days.

(21) Appl. No.: 16/555,895

(22) Filed: Aug. 29, 2019

(65) Prior Publication Data
US 2020/0074689 A1 Mar. 5, 2020

Related U.S. Application Data

(60) Provisional application No. 62/726,113, filed on Aug. 31, 2018.

(51) Int. Cl.
| | | |
|---|---|---|
| *H04N 19/00* | (2014.01) | |
| *G06T 9/00* | (2006.01) | |
| *H04N 19/176* | (2014.01) | |
| *H04N 19/13* | (2014.01) | |
| *G06T 3/40* | (2006.01) | |

(52) U.S. Cl.
CPC ............... *G06T 9/001* (2013.01); *G06T 3/40* (2013.01); *H04N 19/13* (2014.11); *H04N 19/176* (2014.11)

(58) Field of Classification Search
CPC ...... H04N 19/13; H04N 19/176; H04N 19/18; H04N 19/129
See application file for complete search history.

(56) References Cited

U.S. PATENT DOCUMENTS

| | | | |
|---|---|---|---|
| 2013/0177070 A1* | 7/2013 | Seregin | H04N 19/13 375/240.02 |
| 2013/0188699 A1 | 7/2013 | Joshi et al. | |
| 2013/0230097 A1 | 9/2013 | Sole Rojals et al. | |
| 2014/0307777 A1* | 10/2014 | Sole Rojals | H04N 19/176 375/240.02 |
| 2015/0358621 A1 | 12/2015 | He et al. | |
| 2019/0124340 A1* | 4/2019 | Young | H04N 19/176 |

(Continued)

FOREIGN PATENT DOCUMENTS

| | | |
|---|---|---|
| JP | 2016129366 A | 7/2016 |
| KR | 1020180044969 A | 9/2013 |

OTHER PUBLICATIONS

International Search Report and Written Opinion for International Appln. No. PCT/US2019/049095 dated Dec. 19, 2019, 10 pages.

*Primary Examiner* — Li Liu
(74) *Attorney, Agent, or Firm* — Fountainhead Law Group P.C.

(57) ABSTRACT

In some embodiments, a method determines a plurality of classes of bins that are used to determine a context model for entropy coding of a current block in a video. The method calculates a first value for a first class of bins in the plurality of classes of bins and calculates a second value for a second class of bins in the plurality of classes of bins. The first value for the first class of bins is weighted by a first weight to generate a weighted first value and the second value for the second class of bins is weighted by a second weight to generate a weighted second value. The method then selects a context model based on the first weighted value and the second weighted value.

20 Claims, 16 Drawing Sheets

(56) References Cited

U.S. PATENT DOCUMENTS

| | | | |
|---|---|---|---|
| 2019/0238865 A1* | 8/2019 | Han | H04N 19/82 |
| 2020/0382810 A1* | 12/2020 | LeLeannec | H04N 19/18 |
| 2021/0014483 A1* | 1/2021 | Panusopone | H04N 19/11 |
| 2021/0014512 A1* | 1/2021 | Stegemann | H04N 19/157 |

* cited by examiner

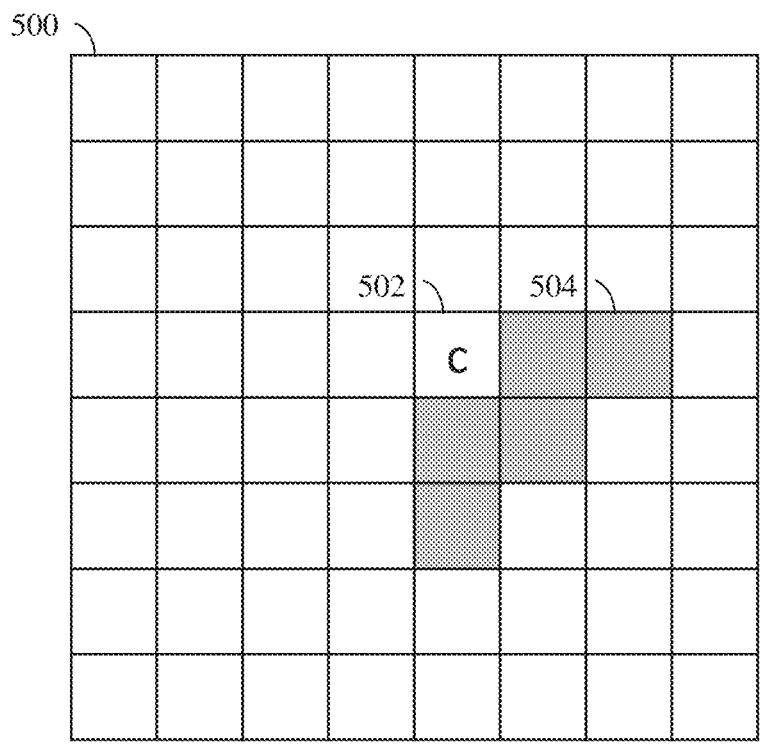
 : current bin 502
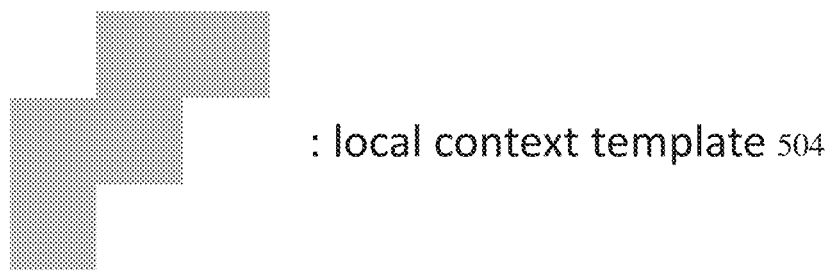 : local context template 504
FIG. 5

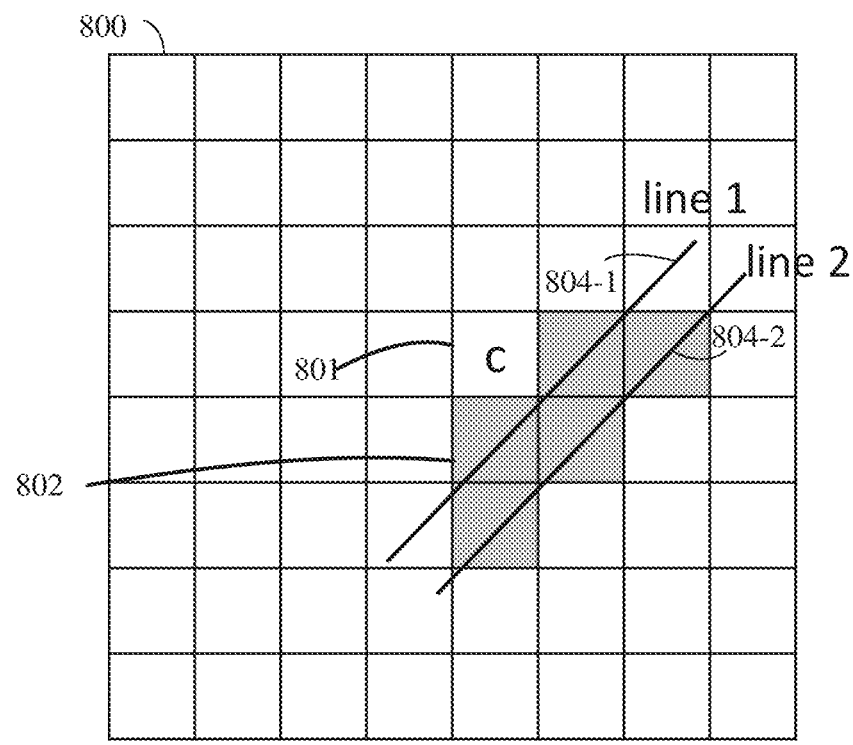
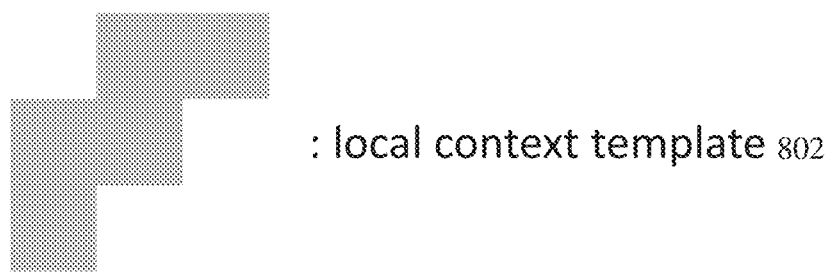
FIG. 8

```
function context_modeling:
    sum0 = sum1 = 0
    for i in line1:
        if binX at position i > 0:
            sum0 += 1         ⎯ 1006
    for i in line2:
        if binX at position i > 0:
            sum1 += 1  ⎯ 1008
    context_index = a * sum0 + b * sum1
                  1002⎺  1004⎺
1010⎺
```

```
sum_bin0_line0 = sum_bin0_line1 = 0       ⎱ 1202
sum_bin1_line0 = sum_bin1_line1 = 0       ⎰
for i in line1:                           ⎫
    if bin1 at position i > 0:            ⎬ 1204
        sum_bin1_line0 += 1               ⎭
for i in line2:
    if bin1 at position i > 0:
        sum_bin1_line1 += 1
if both sum_bin1_line0 and sum_bin1_line1 are 0:  ⎯ 1206
    for i in line0:                       ⎫
        if bin0 at position i > 0:        ⎬ 1208
            sum_bin0_line0 += 1           ⎭
    for i in line1:
        if bin0 at position i > 0:
            sum_bin0_line1 += 1
    context_index = c * sum_bin0_line0 + d * sum_bin1_line1 ⎯ 1210
else
    context_index = a * sum_bin0_line0 + b * sum_bin1_line1 ⎯ 1212
```

1200

FIG. 12 ame # COEFFICIENT CONTEXT MODELING IN VIDEO CODING

CROSS REFERENCE TO RELATED APPLICATIONS

Pursuant to 35 U.S.C. § 119(e), this application is entitled to and claims the benefit of the filing date of U.S. Provisional App. No. 62/726,113 filed Aug. 31, 2018, the content of which is incorporated herein by reference in its entirety for all purposes.

BACKGROUND

In a video coding framework, a transcoder transcodes video content via a set of processes: prediction, transformation, quantization, and entropy coding. In entropy coding, a context modeling process is applied on transformed coefficients that are received from a transform and quantization block. The entropy coding uses a context model to predict a probability of characteristics of the transformed coefficients. The existing methods use a fixed local pattern to calculate the context model for a current block being coded. For example, a fixed pattern of coefficients from other blocks near the current block is used, which may not achieve the most efficient compression.

BRIEF DESCRIPTION OF THE DRAWINGS

FIG. 5 depicts an 8×8 block example to illustrate a template according to some embodiments.

FIG. 8 depicts a coefficient block for a context modeling process that uses classes of bins according to some embodiments.

FIG. 10 depicts pseudocode for position-based context modeling according to some embodiments.

FIG. 12 depicts pseudocode for cross-plane context modeling according to some embodiments.

DETAILED DESCRIPTION

Described herein are techniques for a video coding system. In the following description, for purposes of explanation, numerous examples and specific details are set forth in order to provide a thorough understanding of some embodiments. Some embodiments as defined by the claims may include some or all of the features in these examples alone or in combination with other features described below, and may further include modifications and equivalents of the features and concepts described herein.

Compared with the existing methods in which a fixed pattern is used to calculate a context model, some embodiments adaptively generate a more flexible context model to reflect the probability of predicting the characteristics of transformed coefficients. The improvements include: 1) taking a distance from a current block being coded into consideration when determining the context model; 2) using a cross-bin dependency when deriving the context model; and/or 3) using a flexible control of a local template size and a number of context models used.

With the enhanced context modeling method, the accuracy of entropy coding on the transformed coefficients may increase, which results in fewer bits being used in presenting the transformed coefficients. This is because an entropy coding block in a video coder highly relies on probability distributions of input syntax values/strings. Context models represent the probabilities and the process of context modeling is used to derive the probabilities in real time. If the context modeling is designed properly and the derived probability is close to the actual probability, the entropy coding model may generate an efficient bit representation of the syntax values. Otherwise, if the estimated probability is different from the actual probability, the entropy coding may work, but not at the most efficient bit representation, and the resulting bitstream may use more bits than the optimal model. Thus, the accuracy of the context models may allow a transcoder to use fewer bits to represent a video stream. Using fewer bits to code transformed coefficients also improves the compression performance of the transcoder.

System

Figure 1:
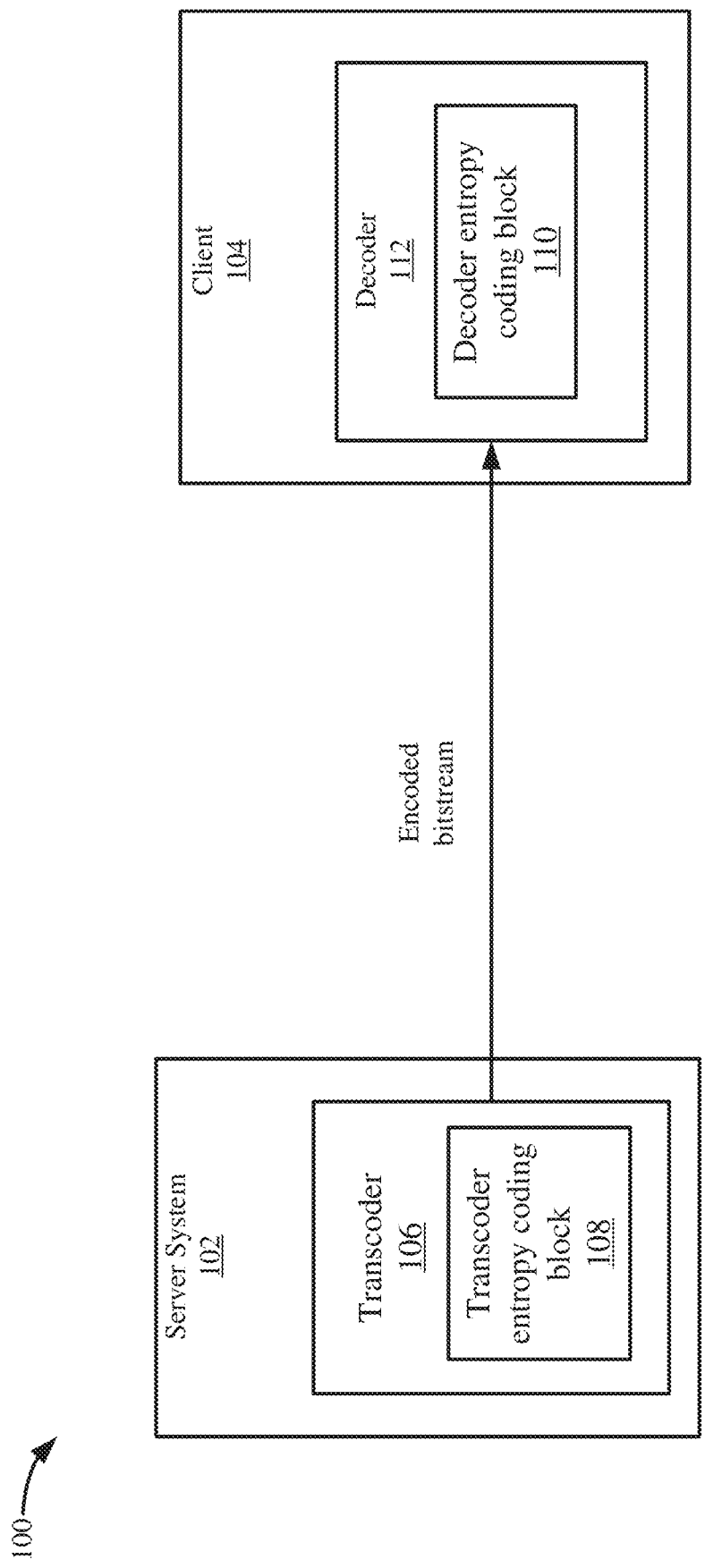
FIG. 1 depicts a simplified system for performing entropy coding according to some embodiments.

FIG. 1 depicts a simplified system 100 for performing entropy coding according to some embodiments. System 100 transcodes a source video asset, which may be any type of video, such as for a television show, movie, or video clip. The source video may need to be transcoded into one or more formats, such formats at one or more bitrates. In some embodiments, a server system 102 sends an encoded bitstream to client 104. For example, server system 102 may be sending a video to a client 104 for playback.

Server system 102 includes a transcoder 106 that transcodes a video into an encoded bitstream. Transcoder 106 may be a software video processor/transcoder configured on a central processing unit (CPU), a hardware accelerated video processor/transcoder with a graphical processing unit (GPU), a field programmable gate array (FPGA), and/or a hardware processor/transcoder implemented in an application-specific integrated circuit (ASIC). Transcoding may be the conversion from one digital format to another digital format. Transcoding may involve decoding the source format and encoding the source video into another digital format, or converting the source content into videos with a specific resolution, framerate, bitrate, codec, etc. Also, encoding may be the conversion of analog source content to a digital format. As used, the term transcoding may include encoding.

During the transcoding process, a transcoder entropy coding block 108 performs entropy coding for a current block of a current frame. Entropy coding may be used to compress different aspects of the coding process; however, some embodiments focus on the entropy coding for transformed coefficients, which is the prediction residual processed by a transform and quantization block. The prediction residual corresponds to the difference between an input prediction unit (PU) and a predicted prediction unit. The difference is transformed and quantized and then entropy coding is performed.

Transcoder 106 transmits the resulting encoded bitstream to decoder 112 over a network or other types of medium. Decoder 112 receives the encoded bitstream and inputs it into a decoder entropy coding block 110 to recover the information needed for decoding process.

Figure 2A:
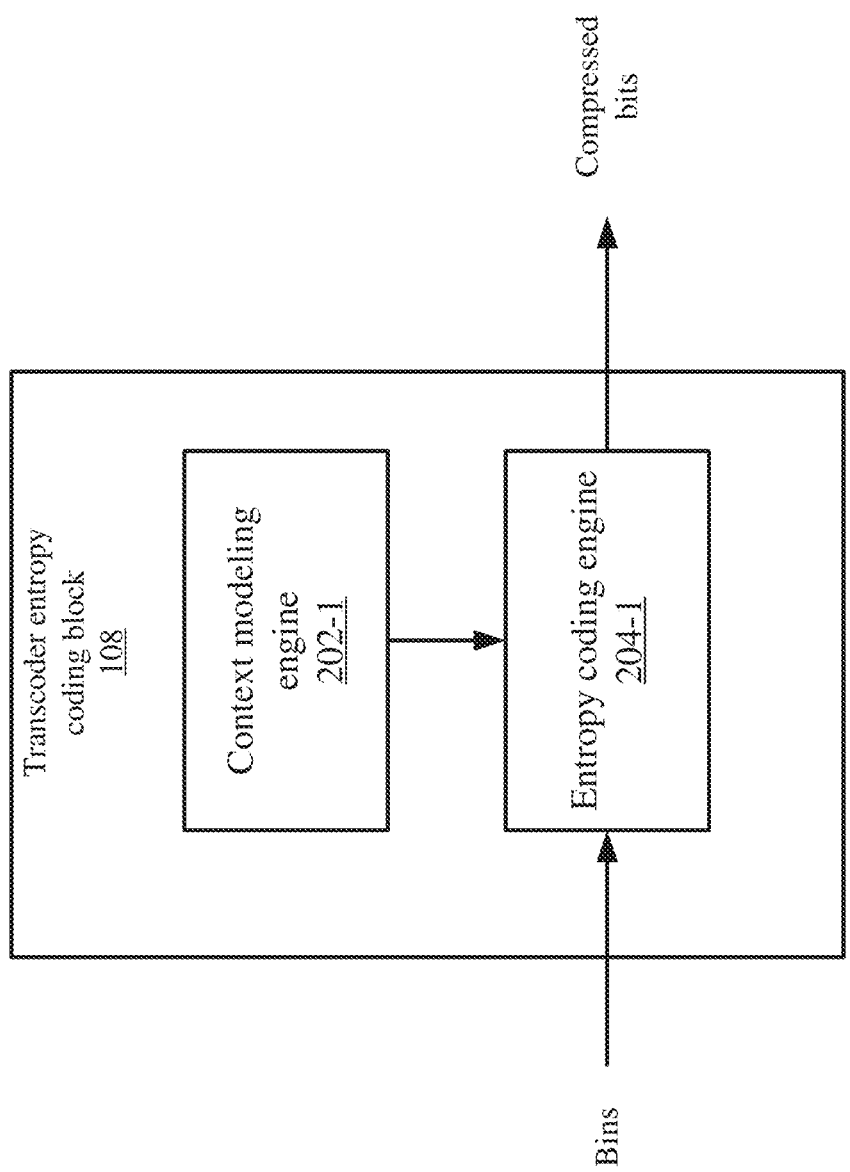
FIG. 2A depicts an example of a transcoder entropy coding block according to some embodiments.

FIG. 2A depicts an example of transcoder entropy coding block 108 according to some embodiments. Entropy coding engine 204-1 compresses a string of binaries (e.g., binary numbers that are referred as bins) into compressed bits. Theoretically, entropy coding can achieve effective compression based on the probabilities of predicting the value of the uncompressed bins as discussed above. The context is the probability that predicts a bin's value, and the process to determine the probability is performed in context modeling engine 202-1. Context modeling engine 202-1 may determine a context model, the process of which is refined compared to the process in the Background as will be described below. The context model includes a context index, which is a discrete representation of different probabilities. The context model is a probability model for one or more bins of a binarized symbol. Context modeling engine 202-1 selects the context model from a selection of available models depending on the statistics of recently coded data symbols. The context model stores the probability of each bin being "1" or "0". Once selected, the context model is input into the entropy coding engine 204-1, which uses the context model to transcode bits.

Figure 2B:
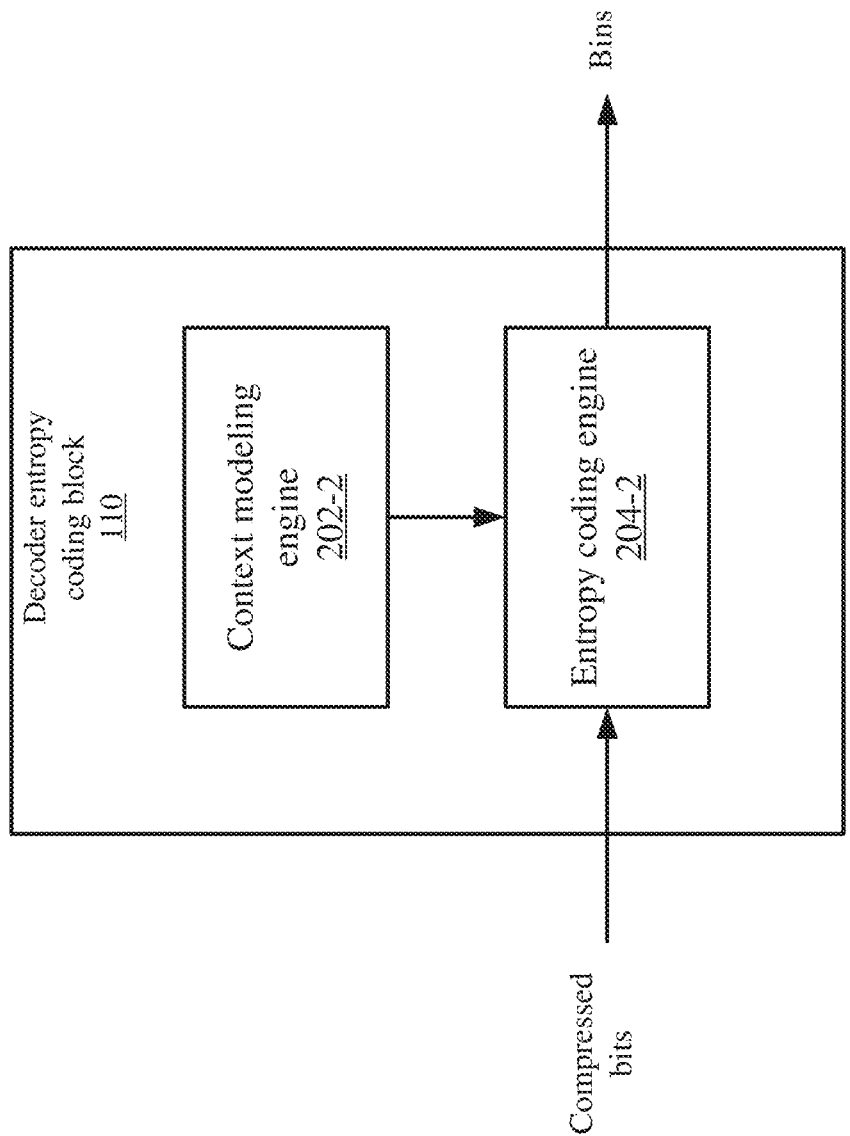
FIG. 2B depicts an example of a decoder entropy coding block according to some embodiments.

FIG. 2B depicts an example of decoder entropy coding block 110 according to some embodiments. Entropy coding engine 204-2 receives a compressed string of binaries and determines a string of binaries (e.g., binary numbers that are referred as bins) from the compressed bits. Context modeling engine 202-2 may determine a context model similarly to described above with respect to context modeling engine 202-1. Context modeling engine 202-2 selects the context model from a selection of available models depending on the statistics of recently decoded data symbols. The context model stores the probability of each bin being "1" or "0". Once selected, the context model is input into the entropy coding engine 204-2, which uses the context model to decode compressed bits into bins.

Entropy Coding

Figure 3:
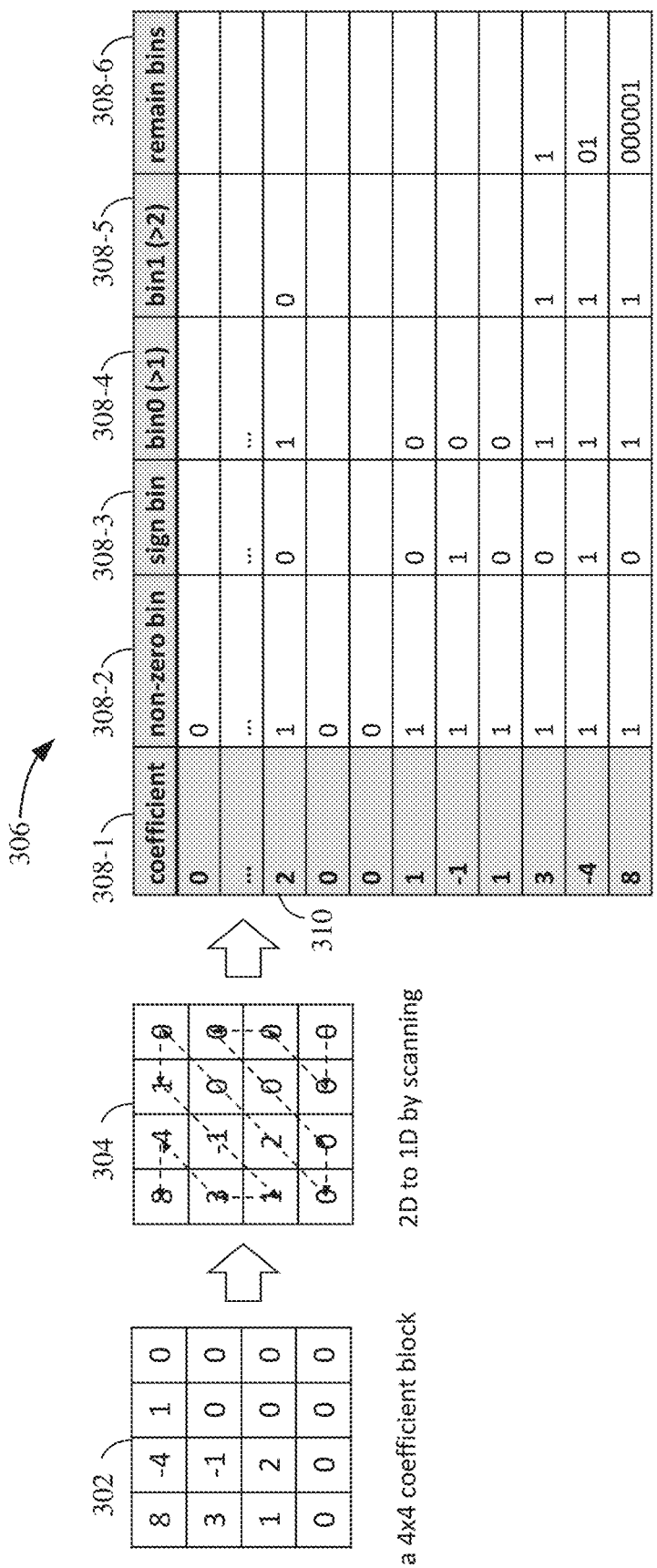
FIG. 3 depicts an example of a 4×4 coefficient block to illustrate the procedure of entropy coding for transformed coefficients according to some embodiments.

FIG. 3 provides an example of a 4×4 coefficient block 302 to illustrate the procedure of entropy coding for transformed coefficients according to some embodiments. Although a 4×4 coefficient block is described, blocks of other sizes may also be used. One distribution of the coefficients includes higher coefficient values that are centralized to the top-left corner, and zero coefficients mostly are located at the bottom-right corner. Context modeling engine 202 performs a binarization process at 304 to convert the coefficients in two-dimensional (2D) data into a one-dimensional (1D) array at 306. One-dimensional data may be binary numbers and two-dimensional data may be a number that represents a binary number. For example, a two-dimensional piece of data may be the number "2" and the one-dimensional array for that number may be the binary numbers "1010".

Context modeling engine 202 scans the coefficients according to a fixed pattern starting from the bottom-right corner to the top-left corner of the block. The last step is to convert the coefficient values into strings of bins. Table 306 shows a possible result of binarization of the coefficients. A first column 308-1 lists the coefficient value from the scan. Context modeling engine 202 determines the values in columns 308-2 to 308-6 based on the value of each coefficient. Table 306 includes the following characteristics:

1. The sign of a coefficient is conveyed by a bin called a sign bin in column 308-3. The sign bin is set to a value of 0 for a positive coefficient or set to a value of 1 for a negative coefficient.

2. The volume of a coefficient is always separated into multiple bin planes, such as a non-zero bin, a sign bin, a bin0, a bin1, and the remaining bins.
   a. A non-zero bin in column 308-2 indicates if current coefficient has a non-zero volume.
   b. For the non-zero coefficients, a sign bin in column 308-3 is equal to 0 or 1 and indicates if the coefficient is positive or negative, respectively.
   c. Bin0 in column 308-4, also known as the greater-than-one bin, is equal to 1 when the volume of the coefficient is larger than 1. Otherwise, context modeling engine 202 sets bin0 to 0 and no more bins are needed for the current coefficient.
   d. Similarly, bin1 in column 308-5 indicates if the volume of coefficient is greater than 2.
   e. Lastly, the remaining bins in column 308-6 are used to represent the value of the last coefficients (e.g., coefficient volume>2), which should be a unique bin string.

As shown at 310, the one-dimensional value for the coefficient "2" is "1010" in table 306. Table 306 also stores the one-dimensional values for the other coefficients. The processing details of generating the table in FIG. 3 may vary in the implementations of different coding standards, but the general concept is shared in the different video coding standards.

Figure 4:
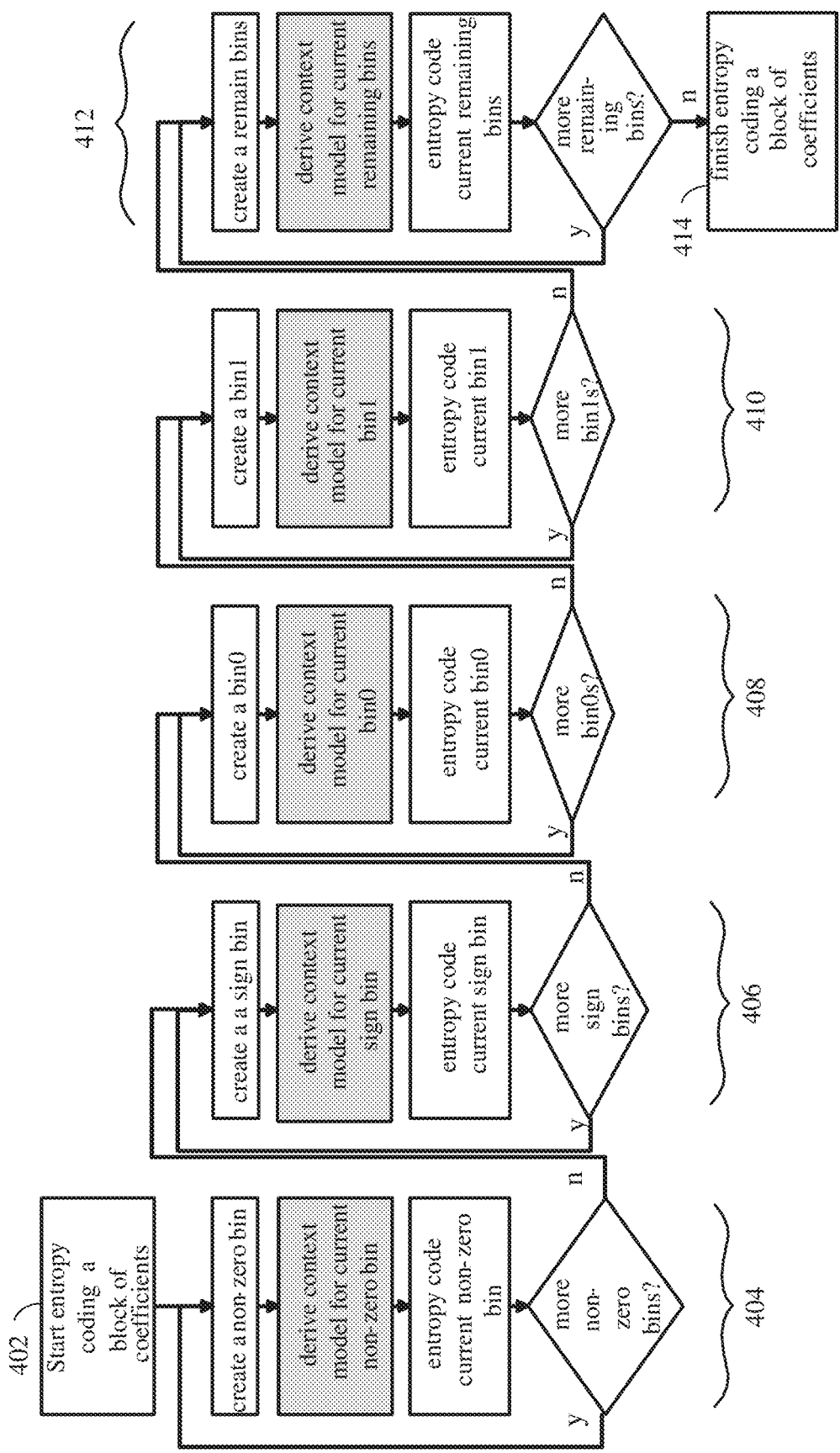
FIG. 4 depicts a flowchart of processing a block of transformed coefficients according to some embodiments.

To describe the procedure of entropy coding for the transformed coefficients, FIG. 4 depicts a flowchart 400 of processing a block of transformed coefficients according to some embodiments. At 402, context modeling engine 202 starts encoding a block of coefficients. At 404, context modeling engine 202 creates a non-zero bin, derives a context model for the current non-zero bin, and entropy codes the current non-zero bin. After that, context modeling engine 202 determines whether more non-zero bins are needed. If so, the process reiterates to create another non-zero bin and the same process to entropy code another non-zero bin is performed. When there are no more non-zero bins, the process proceeds to the sign bin.

At 406, context modeling engine 202 creates a sign bin, derives a context model for the current sign bin, and entropy codes the current sign bin. After which, context modeling engine 202 determines whether more sign bins are needed. If so, the process reiterates to create another sign bin and the same process to entropy code the another sign bin is performed. When there are no more sign bins, the process proceeds to the bin0 bin.

At 408, context modeling engine 202 creates a bin0 bin, derives a context model for the current bin0 bin, and entropy codes the current bin0 bin. After which, context modeling engine 202 determines whether more bin0 bins are needed. If so, the process reiterates to create another sign bin and the same process to entropy code the another bin0 bin is performed. When there are no more bin0 bins, the process proceeds to the bin1 bin.

Context modeling engine 202 performs the process described above for the bin1 bin at 410 and for any remaining bins at 412. At 414, context modeling engine 202 finishes entropy coding the block of coefficients.

Each bin being entropy coded requires a context modeling procedure to be performed to receive the probability status from a context model when the bin is being coded (e.g., in real-time). Different context modeling methods may be used for different bins. For example, a template may be used to determine the context model. FIG. 5 depicts an 8×8 block example 302 to illustrate a template according to some embodiments. Context modeling engine 202 may be processing a coefficient block 500. For the current processing bin, which is presented as a current block c at 502, context modeling engine 202 calculates the context model for the current processing bin using a number of neighboring bins that have been already processed. For example, a local context template 504 includes five neighboring boxes in coefficient block 500, which represent the neighboring bins, which have already been processed.

Different methods for scanning of the transformed coefficients may be used. For a first method, which is shown in FIG. 3 at 304, the transformed coefficient scan is separated into multiple scan passes. In the first pass, a flag bin0 (indicates whether the magnitude of the coefficient is larger than 0; 1 means yes, 0 means no) is coded. In the next two passes, two flags bin1 and bin2 (which indicate whether the magnitude of the coefficient is larger than 1 and 2, respectively; 1 means yes, 0 means no) are coded. In the final two passes, the remaining values are coded. In a second method, the transform coefficients are coded in a single scan pass. All flags (bin0, bin1, bin2, and remaining values) for a scan position are coded before any data for the next scan position are transmitted. In the first method, for coding the current coefficient, the information from coefficients covered by the local context template is used to derive context model. That is, for coding bin0, the sum of values for bin0 in the local context template is used to derive context model; for coding of bin1, the sum of values for bin1 in the local context template is used to derive context model. For the second method, the information from coefficients covered by the local context template is also used to derive context model, but some details of processing are different. For example, for coding bin0, the sum of the magnitudes of the coefficients in the local context template is used to derive context model. The pseudocode for the context modeling is as follows:

```
function context_modeling:
    context_index = 0
    for i in local template:
        if binX at position i > 0:
            context_index += 1
```

Figures 6A, 6B:
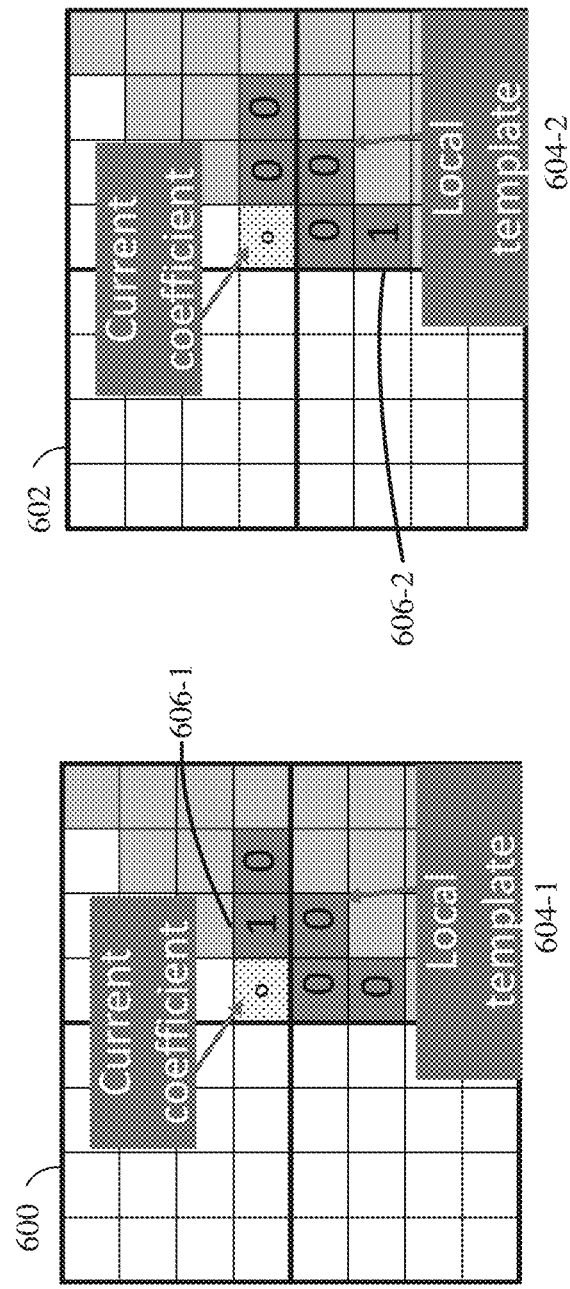
FIG. 6A and FIG. 6B depict an example of where two local templates will have the same context even though the coefficients in the local template are different according to some embodiments.

In brief, the non-zero bins within the local context template are counted and output as the context model index for current bin c. There are some drawbacks in the previous methods:

1. The neighboring bins covered in the local template are mixed together with equal weight, which means these neighboring bins have the same correlation with the current bin. Some embodiments may differentiate them, since the bins closer to the current bin may have stronger correlation with the current bin. FIG. 6A and FIG. 6B show an example where two local templates have the same context model when not differentiated even though the coefficients in the local template are different according to some embodiments. FIG. 6A depicts a first coefficient block 600 and FIG. 6B depicts a second coefficient block 602. First coefficient block includes a local template 604-1 and second coefficient block 602 includes a second local template 604-2. At 606-1, local template 604-1 has a bit of "1" that is closer to the current coefficient compared to a bit of "1" at 606-2 in local template 604-2. Coefficients that are closer to the current coefficient may have a stronger correlation with the current coefficient because these coefficients may be from content that is closer to the content of the current coefficient. One reason that closer coefficients have stronger correlation is because natural video includes a gradual transition of texture, which will be represented as a set of residual coefficients close to each other.

2. The local context template does not use information from previous string bin planes. For example, when coding bin1, only the processed bin1 from the local template are used to derive the context model for current bin1. The whole bin0 plane has been processed, but the bin0 information is not used by bin1 plane.

Figures 7A, 7B:
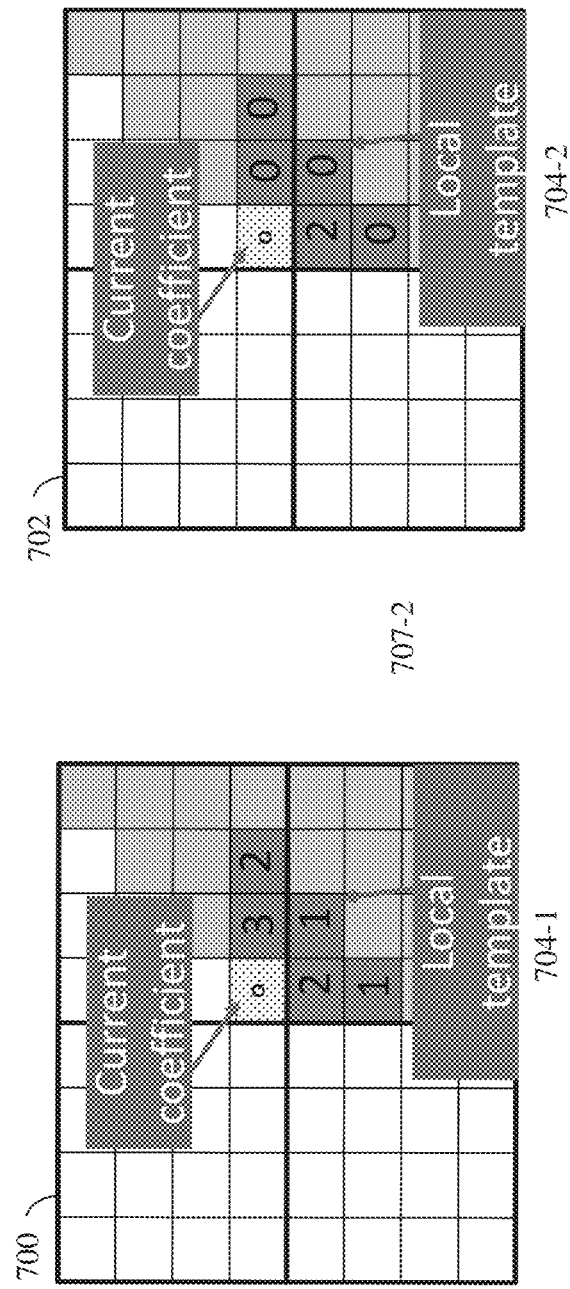
FIGS. 7A and 7B depict an example of where varying a number of context models may be useful according to some embodiments.

3. The number of the context models used in the coding process is fixed without considering the input video characteristics, such as the quantization parameters being used, number of non-zero coefficient values, etc. FIGS. 7A and 7B show an example of where varying a number of context models may be useful according to some embodiments. Previously, the number of context models are the same for coefficient blocks 700 and 702 shown in FIGS. 7A and 7B even though the coefficient values are different. For example, a local template 704-2 in coefficient block 702 includes mostly zero values and a local template 704-1 in coefficient block 700 includes all non-zero values. It may be better to use more context models in local template 704-1 and use fewer context models in local template 704-2, since more context models can accurately capture the statistics of transform coefficients blocks with more non-zero coefficients. Also, using fewer context models can avoid the context dilution problem for blocks with fewer non-zero coefficients as more context models may not be needed when most of the coefficients are zero.

Position-based Context Modeling

Considering the above issues, the previous methods may not generate highly accurate context models for the transformed coefficients, which results in lower compression efficiency. To overcome not differentiating the bins in the local template, FIG. 8 depicts a coefficient block 800 for a context modeling process that uses classes of bins according to some embodiments. Context modeling engine 202 analyzes the distance between a current bin c and the neighboring bins in a local context template 802 when calculating the context model. Based on the position of a bin related to current bin c 801, context modeling engine 202 categorizes the bins in the local context template into different classes, such as lines referred to as a line1, a line2, etc. The line1 class at 804-1 may contain the nearest subset of neighboring bins, which could be given more weight during the derivation of context model of bin c. For example, the line1 class includes two bins that have sides that are neighboring current bin c. The line2 class at 804-2 is located farther from bins in the line1 class, and may be given less weight in the calculation because the bins may be less similar to current bin c 801. For example, the line2 class includes three bins that have sides that neighbor the two bins in line1. The bins in the line2 class do not have sides that neighbor the current bin c 801. In some embodiments, the distance from current bin c may be measured from a point in a bin, such as a center point of each bin to the center point of current bin c.

Figure 9:
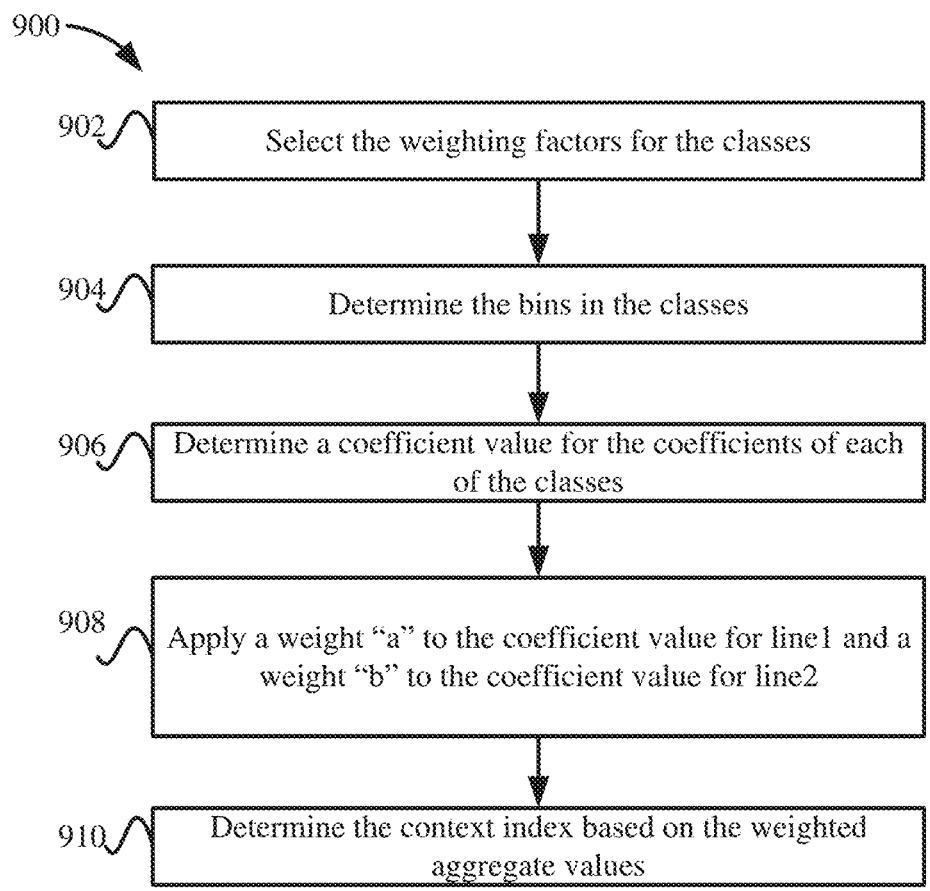
FIG. 9 depicts a simplified flowchart of a method for determining the context model using position-based context modeling according to some embodiments.

FIG. 9 depicts a simplified flowchart 900 of a method for determining the context model using position-based context modeling according to some embodiments. At 902, context modeling engine 202 selects the weighting factors for the classes. In some embodiments, the classes may be lines, but the classes may be determined in other ways.

At 904, context modeling engine 202 determines the bins in the classes. For example, context modeling engine 202 selects bins that are in a position corresponding to a line line1 and a line line2 as shown in FIG. 8. Context modeling engine 202 may use the position of the current bin to set the position of the lines. In some embodiments, for a given position C at (x,y), context modeling engine 202 can calculate the five neighboring positions of a, b, c, d, and e using a coordinates calculation. For example, the position a is (x+1, y), the position b is (x, y+1), the position c is (x+2, y), the position d is (x+1, y+1), and the position e is (x, y+2). Then, positions a and b will be in the line-1 class, while positions c, d, and e are in line-2 class.

At 906, context modeling engine 202 determines a coefficient value for the coefficients of each of the classes. For example, context modeling engine 202 computes an aggregation (e.g., sum) of the bins with non-zero coefficients for each line. Other calculations may be used, however, such as an average of the coefficients.

At 908, context modeling engine 202 applies a weight "a" to the coefficient value for line1 and a weight "b" to the coefficient value for line2. For example, context modeling engine 202 may multiply the weight with the sum of the coefficients. At 910, context modeling engine 202 determines the context index based on the weighted aggregate values. For example, the content index is the combination of the weighted sums for line1 and line2. The context model for a certain bin may be a list of integers. The integer value can be translated to probability inside context modeling engine 202. At 912, context modeling engine 202 sends the context index to entropy coding engine 204, which uses the context index to determine the context model to use in the entropy coding.

FIG. 10 depicts pseudocode 1000 for a position-based context modeling process according to some embodiments. At 1002 and 1004, the variables a and b are weighting factors for the sums of the bins in line1 and line2, respectively. In some embodiments, the class of bins whose distance to current bin is smaller may use a larger weighting factor because these bins may be more similar to the current bin. Also, context modeling engine 202 may analyze the bins to determine the bins that are most similar to the current bin. When using the positioning of the two lines, at 1006, context modeling engine 202 combines the sum of non-zero coefficients for the blocks in line1. For example, "sum+=1 adds a value of "1" to the sum when a bin has a non-zero coefficient. Then, at 1008, context modeling engine 202 combines the sum of non-zero coefficients for the blocks in line2. At 1010, context modeling engine 202 applies a weight "a" to the sum for line1 and a weight "b" to the sum for line2. The context index is the combination of the weighted sums for line1 and line2. If the blocks in line1 are given a higher weight, then those blocks may have more influence on the context index. Accordingly, if the blocks in line1 are more similar to the current coefficient, then the content model may be more accurate compared to when no weights are used.

Cross-Plane Context Modeling

Figure 11:
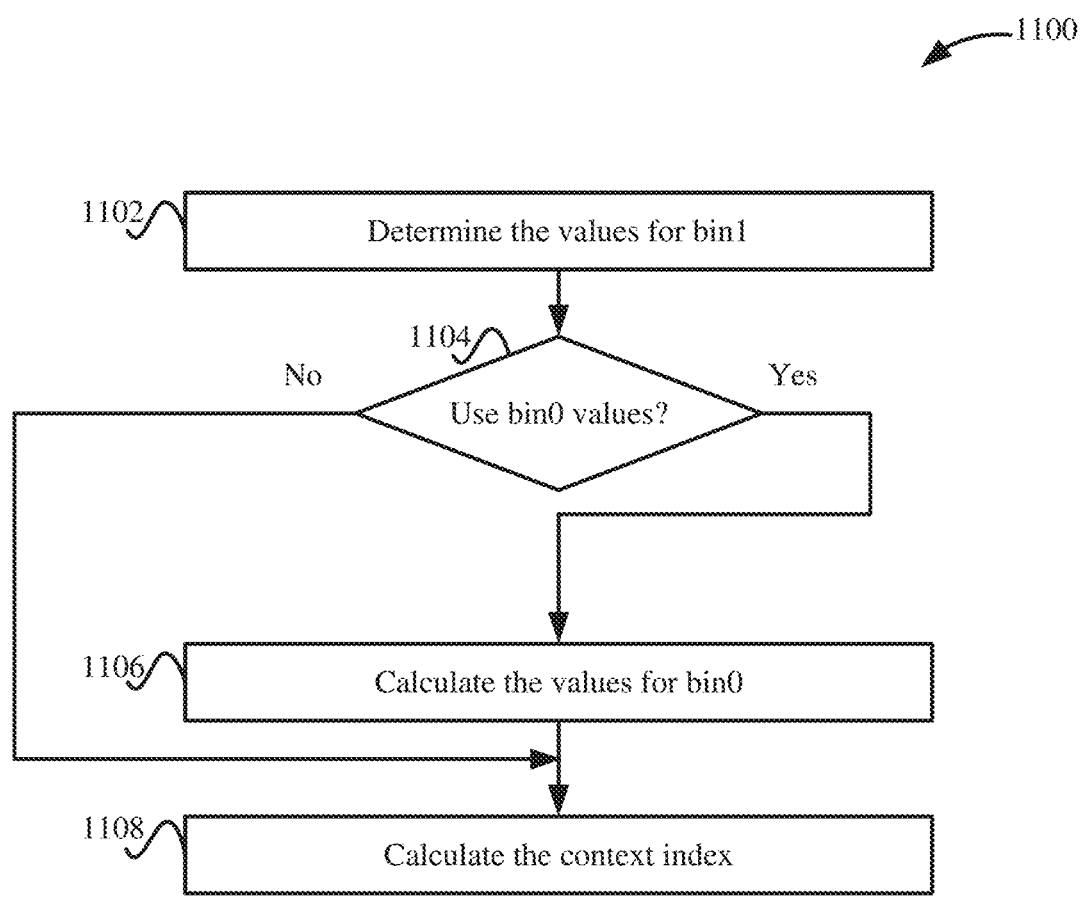
FIG. 11 depicts a simplified flowchart for cross-plane context modeling according to some embodiments.

To use information from previous bin planes, context modeling engine 202 may use a cross-plane context modeling process. For example, when processing a current bin1, context modeling engine 202 may use the previously processed bin1 values for bins in the local context template, but may also use the previously processed bin0 values for bins in the local context template to derive the context model. FIG. 11 depicts a simplified flowchart 1100 for cross-plane context modeling according to some embodiments. At 1102, context modeling engine 202 determines the values for bin1. For example, context modeling engine 202 determines the coefficient values for the lines line1 and line2 of bin1.

At 1104, context modeling engine 202 determines if bin0 values should be used. For example, context modeling engine 202 determines a sum of the bins with non-zero values of line1 and line2 for bin1. Then, context modeling engine 202 determines if the sum meets a threshold. For example, if the sum of the values of line1 and line2 are zero, then context modeling engine 202 reviews the bins with non-zero values in bin0. In other examples, if the sum of the bins with non-zero values of line1 and line2 are below a threshold, then context modeling engine 202 reviews the values of bin0. If the bins with non-zero values of line1 and line2 for bin1 are below a threshold (or zero), then not much information can be inferred from the coefficients to determine a context model. However, the bins with non-zero values for another bin, such as bin0, may be used to infer some information for the context model. In some cases, using the information from bin0 may generate a more accurate estimation of the context model for bin1. Accordingly, at 1106, context modeling engine 202 calculates the values for bin0 when these values are to be used in determining the context model.

At 1108, context modeling engine 202 calculates the content index. For example, if values from bin0 are not being used, then context modeling engine 202 uses only the bin1 values to calculate the content index. If values from bin0 are being used, then context modeling engine 202 uses the bin1 values and the bin0 values to calculate the content index.

The above process may also be used for the remaining bins, which may use values from the bin1 and/or bin0.

FIG. 12 depicts pseudocode 1200 for cross-plane context modeling according to some embodiments. At 1202, context modeling engine 202 sets the sum of the values of line1 and line2 to zero for bin0 and bin1. At 1204, context modeling engine 202 calculates the sum of bins with non-zero values for bin1 in each of lines line0 and line1. At 1212, if the values of bin1 were not zero, then context modeling engine 202 calculates the content index based on the sum of the values for line1 and line2 for bin1.

If the sum of the bins with non-zero values of line1 and line2 for bin1 are zero, then not much information can be inferred from the information from bin1 other than all the values are zero. However, the values for bin0 may be used to infer some information for the context model. At 1206, if the sum of the bins with non-zero values in line1 and line2 for bin1 are zero, then context modeling engine 202 reviews the values of bin0. At 1208, context modeling engine 202 calculates the context model based on the values from line1 and line2 of bin1. In this case, context modeling engine 202 calculates the sum of the bins with non-zero values for line1 and line2 for bin0. Then, at 1210, context modeling engine 202 calculates the content index based on the sum of the values for line1 and line2 for bin0. Since the values of bin1 are all zero, using the values for bin0 may generate a more accurate estimation of the context index for bin1.

Adaptive Context Modeling Process

In the position-based context modeling process and cross-plane context modeling process, context modeling engine 202 may dynamically determine the template size and/or the number of context models. Using an adaptive template size and/or an adaptive number of context models provides a tradeoff between the complexity and the compression gain. For example, more lines of a local context template and a larger number of context models may result in a more accurate context model and higher compression efficiency ultimately, but with a higher computation complexity. The larger number of context models may be able to predict a coefficient's value with more granularity because a larger range of context models are used. However, using more lines in the local context template requires more computations. The process provides a flexible way to select a proper template size and number of context models based on different characteristics of the video, such as video resolution, quantization parameter (QP), position of a current coefficient, and a number of non-zero coefficients in the current local template.

For example, when the input video has a low resolution, the quantization parameter is large, and/or the number of non-zero coefficients in a previous frame is small, context modeling engine 202 may use a smaller number of context indices for a smaller number of context models. The simplest case is where there are only two context indices for two context models. That is, the content indices may be one or two values, such as "0" or "1". For the value of zero, the context model indicates all bins in the template may be zero, and for the value of one, the context model indicates the template includes all non-zero bins. Another example is where the number of context indices equals the number of non-zero bins in the template, such as context index=number of non-zero bins in the template. Another example may use more than two context indices, such as the values of "0", "1", and "2". For the value of zero, the context model indicates all bins in the template are zero, for the value of one, the context model indicates one or two non-zero bins are in the template, and for the value of two, the context model indicates three or four non-zero bins are in the template. Other numbers of context indices and context models may also be used.

In another example, when the video is high resolution, the quantization parameter is small, and/or the number of non-zero coefficients in the local template is large, more context models can be used to increase the accuracy of the entropy coding. For example, the conditions in the video such as high resolution, small quantization parameter, and so on, may generate more non-zero coefficients.

Figure 13:
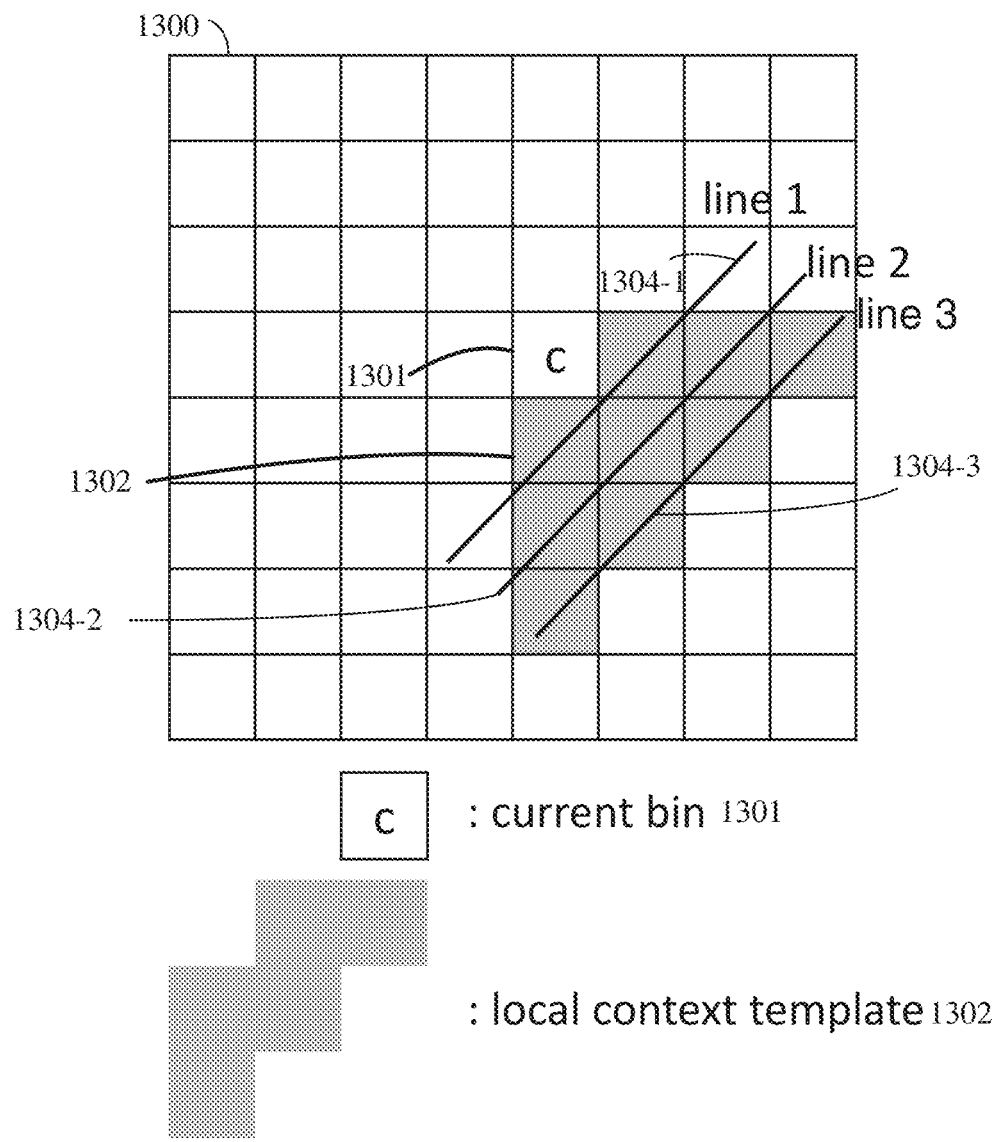
FIG. 13 depicts a coefficient block for a context modeling process that uses an adaptive number of classes of bins according to some embodiments.

More context models can accurately capture the statistics of transform coefficients in blocks with more non-zero coefficients, while less context models can avoid the context dilution problem for blocks with fewer non-zero coefficients. FIG. 13 depicts a coefficient block 1300 for a context modeling process that uses an adaptive number of classes of bins according to some embodiments. Increasing the number of lines increases the number of context models because more neighboring blocks means more possible context models.

Context modeling engine 202 takes into consideration characteristics of the video to determine the number of context models to use. Based on the number of context models, context modeling engine 202 may determine a number of classes to use based on the distance between a current bin c and the neighboring bins in a local context template 1302. Based on the position of a bin related to current bin c 1301, context modeling engine 202 categorizes the bins in the local context template into different classes, such as lines referred to as a line1, a line2, a line3, etc. The line1 class at 1304-1 may contain the nearest subset of neighboring bins, which could be given more weight during the derivation of context model of bin c. For example, line1 includes two bins that are neighboring current bin c 1301. The line2 class at 1304-2 is located farther from bins in the line1 class, and may be given less weight in the calculation because the bins may be less similar to current bin c. For example, line2 includes three bins that neighbor the three bins in line1. The line3 class at 1304-3 is located farther from bins in the line1 class and the line2 class, and may be given less weight in the calculation because the bins may be less similar to current bin c. For example, line3 includes four bins that neighbor the three bins in line1.

System

Figure 14:
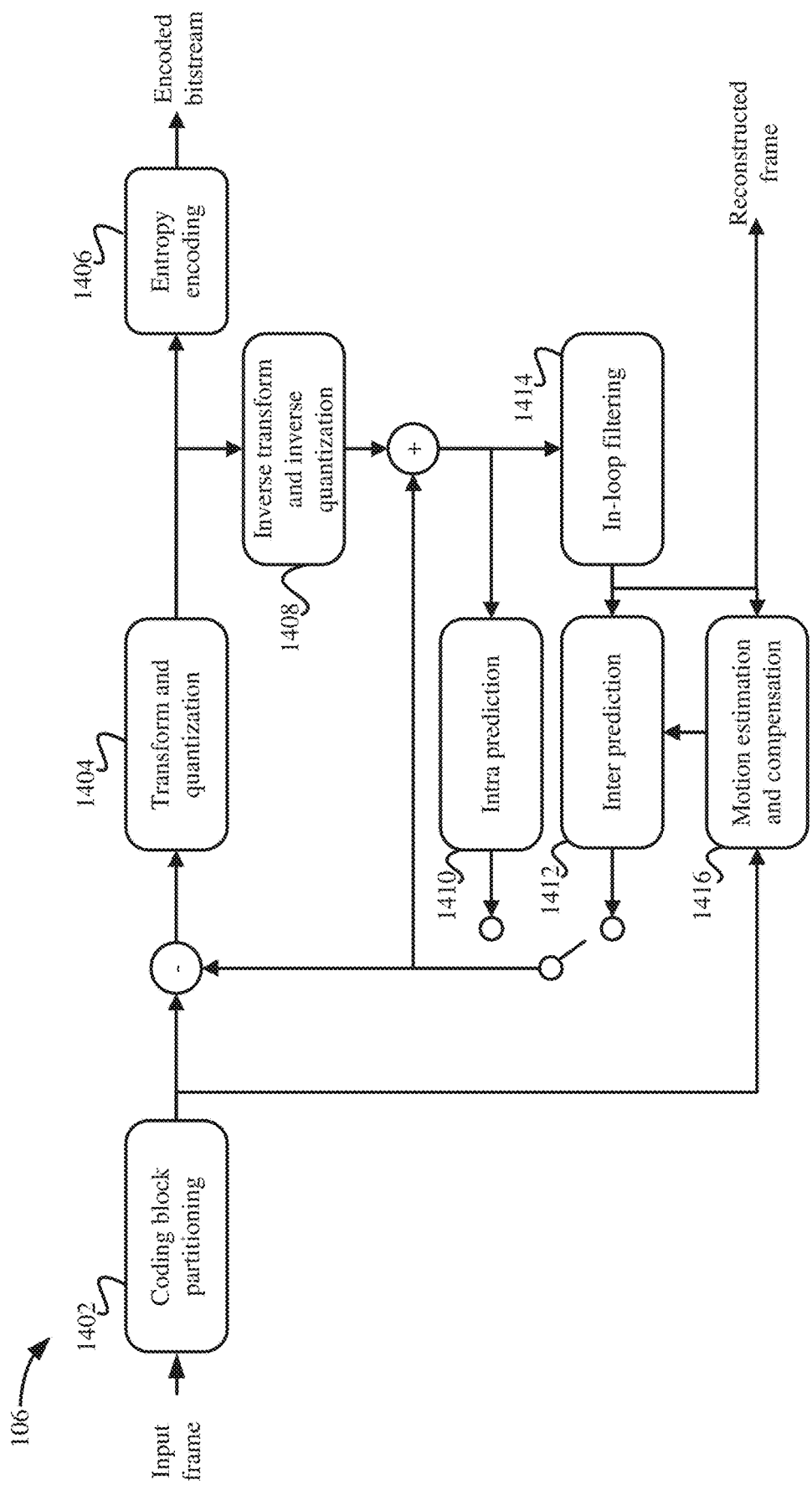
FIG. 14 depicts an example of a transcoding system according to some embodiments.

FIG. 14 depicts an example of a transcoding system according to some embodiments. A video codec framework includes a set of fundamental components: block partitioning, inter and intra prediction, transform and quantization, and entropy coding.

Transcoder 106 receives a frame of a video, which is firstly split into non-overlapping coding blocks for further processing. To cope with different video content characteristics, complex regions will be covered by partitions with smaller sizes, while simple regions will be covered by larger partitions. Multiple block patterns and shapes are may be both used together, for example quad-tree pattern, triple-tree pattern, and binary-tree pattern can be all used together, while square blocks and rectangular blocks can also be used together.

Prediction is used to remove the redundancy of a video signal. By subtracting the predicted pixel values from the pixels being processed, the amplitude of a residual signal can be significantly reduced, thus the resulting bitstream size can be reduced. An intra prediction block 1410, which is using reference pixels in the current frame, aims to reduce the spatial redundancy within the frame. An inter prediction block 1412, which is using reference pixels from neighboring frames, attempts to remove the temporal redundancy between frames. A motion estimation and compensation block 1416 may be a sub-module of inter prediction at the transcoder side, which captures the motion trace of objects among adjacent frames and generates reference pixels for inter prediction.

A transform and quantization block 1404 uses the residual pixels after intra or inter prediction. Transform and quantization block 1404 performs a transform operation that represents the residual signal in a frequency domain. Considering the human visual system is more sensitive to low frequency components of video signal than the high frequency components, quantization is designed to further compress the residual signal by reducing the precision on high frequency signals.

To avoid the out-of-sync issue between transcoder 106 and decoder 112, transcoder 106 contains decoding modules to make sure both transcoder 106 and decoder 112 are using identical mathematical processes. Thus, an inverse transform and inverse quantization block 1408 is similar to the same block on the decoder side. Inverse transform and inverse quantization block 1408 reconstructs pixels using the intra and inter prediction.

An in-loop filter 1414 removes any visual artifacts that are introduced by the above-mentioned processes. Various filtering methods are applied on the reconstructed frame in a cascaded way to reduce different artifacts, including but not limited to the blocking artifacts, mosquito artifacts, color banding effects, etc.

An entropy encoding block 1406 may further compress the bitstream using a model-based method. Transcoder 106 transmits the resulting encoded bitstream to decoder 112 over a network or other types of medium.

Figure 15:
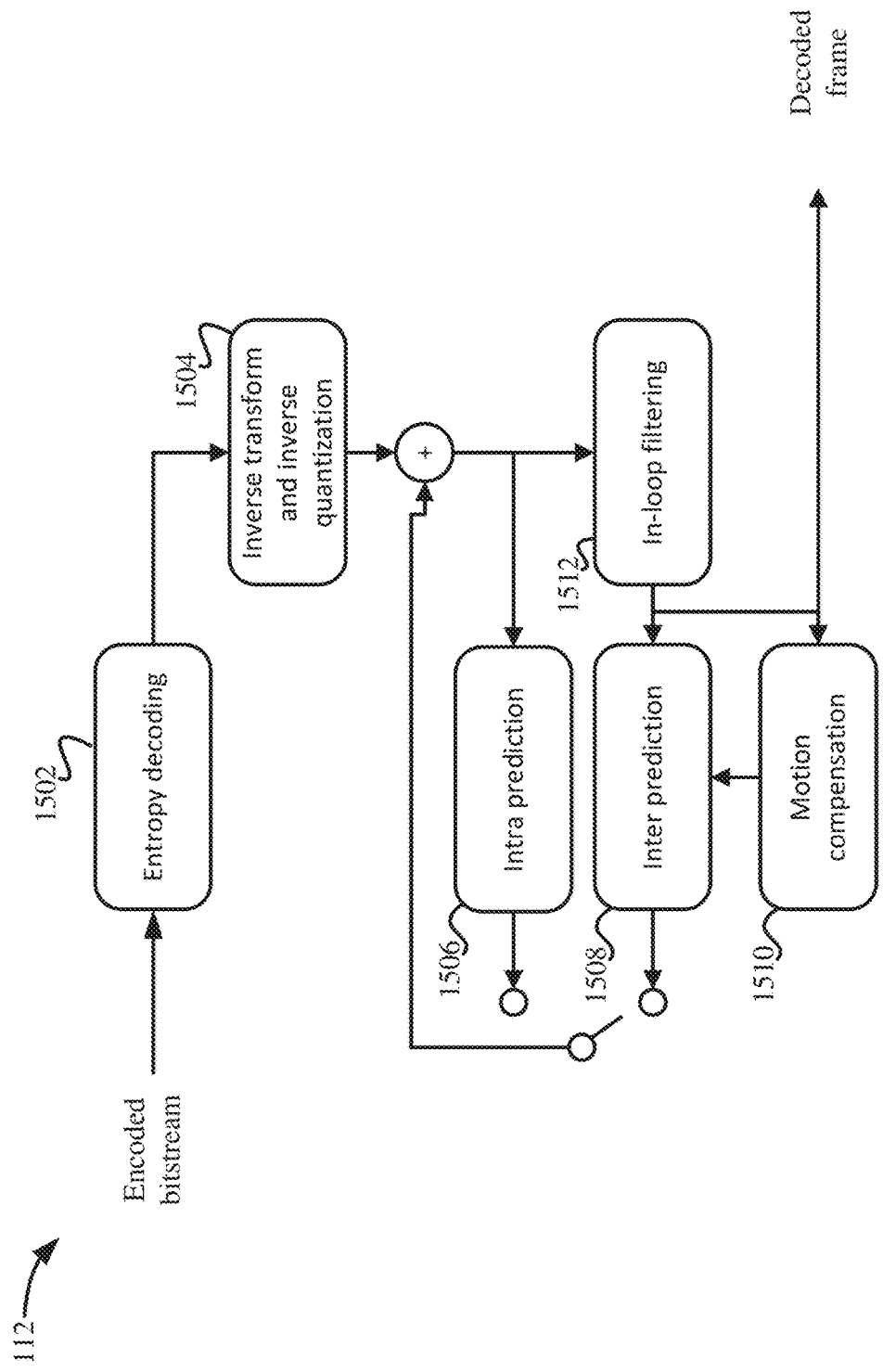
FIG. 15 depicts an example of a decoding system according to some embodiments.

FIG. 15 depicts an example of a decoding system according to some embodiments. Decoder 112 receives the encoded bitstream and inputs it into an entropy decoding block 1502 to recover the information needed for decoding process. As above-mentioned, a decoded frame can be decoded by using an inverse transform and inverse quantization block 1504, an intra prediction block 1506 or inter prediction block 1508, motion compensation block 1510, and in-loop filtering block 1512 in the same way to build a decoded frame.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured or operable to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A method comprising:
    determining, by a computing device, a plurality of classes of bins that are used to determine a context model for entropy coding of a current block in a video;
    calculating, by the computing device, a first value for a first class of bins in the plurality of classes of bins for a first bin plane;
    calculating, by the computing device, a second value for a second class of bins in the plurality of classes of bins for the first bin plane;
    weighting, by the computing device, the first value for the first class of bins by a first weight to generate a weighted first value and weighting the second value for the second class of bins by a second weight to generate a weighted second value;
    selecting, by the computing device, a third value for a second bin plane; and
    selecting, by the computing device, a context model based on the first weighted value, the second weighted value, and the third value.

2. The method of claim 1, wherein a first center point in a first bin in the first class of bins is closer in distance to the current block compared to a second center point in a second bin in the second class of bins.

3. The method of claim 1, wherein center points in bins in the first class of bins are closer in distance to the current block compared to center points in bins in the second class of bins.

4. The method of claim 1, wherein bins in the first class of bins are positioned in a first line and bins in the second class of bins are positioned in a second line.

5. The method of claim 1, wherein the first class of bins and the second class of bins are in a local template for the current block.

6. The method of claim 1, wherein the first weight weights the first class of bins higher than the second weight for the second class of bins.

7. The method of claim 1, wherein selecting the context model comprises:
    selecting a content index based on the first weighted value, the second weighted value, and the third value, wherein the content index points to the context model.

8. The method of claim 1, wherein:
    calculating the first value for a first class of bins in the plurality of classes of bins comprises calculating a first sum based on coefficient values for bins in the first class of bins; and
    calculating the second value for the second class of bins in the plurality of classes of bins comprises calculating a second sum based on coefficient values for bins in the second class of bins.

9. The method of claim 8, wherein:
    the first sum is a first number of bins with non-zero coefficient values in the first class of bins, and
    the second sum is a second number of bins with non-zero coefficient values in the second class of bins.

10. The method of claim 8, wherein:
    weighting the first value for the first class of bins comprises weighting the first sum by the first weight to generate a first weighted sum, and
    weighting the second value for the second class of bins comprises weighting the second sum by the second weigh to generate a second weighted sum.

11. The method of claim 10, wherein selecting the context model comprises using the first weighted sum, the second weighted sum, and the third value to determine the context model.

12. The method of claim 1, wherein determining the plurality of classes of bins comprises adaptively determining a number of the plurality of classes based on characteristics of the video.

13. The method of claim 12, wherein the characteristics comprise one or more of a resolution of the video, a quantization parameter, and a number of non-zero coefficients in a template of bins for the current block.

14. The method of claim 1, wherein determining the plurality of classes of bins comprises adaptively determining a number of the context models based on characteristics of the video.

15. A non-transitory computer-readable storage medium containing instructions, that when executed, control a computer system to be operable for:
- determining a plurality of classes of bins that are used to determine a context model for entropy coding of a current block in a video;
- calculating a first value for a first class of bins in the plurality of classes of bins for a first bin plane;
- calculating a second value for a second class of bins in the plurality of classes of bins for the first bin plane;
- weighting the first value for the first class of bins by a first weight to generate a weighted first value and weighting the second value for the second class of bins by a second weight to generate a weighted second value;
- selecting a third value for a second bin plane; and
- selecting a context model based on the first weighted value, the second weighted value, and the third value.

16. The non-transitory computer-readable storage medium of claim 15, wherein a first center point in a first bin in the first class of bins is closer in distance to the current block compared to a second center point in a second bin in the second class of bins.

17. The non-transitory computer-readable storage medium of claim 15, wherein center points in bins in the first class of bins are closer in distance to the current block compared to center points in bins in the second class of bins.

18. The non-transitory computer-readable storage medium of claim 15, wherein bins in the first class of bins are positioned in a first line and bins in the second class of bins are positioned in a second line.

19. The non-transitory computer-readable storage medium of claim 15, wherein:
- calculating the first value for a first class of bins in the plurality of classes of bins comprises calculating a first sum based on coefficient values for bins in the first class of bins; and
- calculating the second value for the second class of bins in the plurality of classes of bins comprises calculating a second sum based on coefficient values for bins in the second class of bins.

20. An apparatus comprising:
one or more computer processors; and
a non-transitory computer-readable storage medium comprising instructions, that when executed, control the one or more computer processors to be operable for:
- determining a plurality of classes of bins that are used to determine a context model for entropy coding of a current block in a video;
- calculating a first value for a first class of bins in the plurality of classes of bins for a first bin plane;
- calculating a second value for a second class of bins in the plurality of classes of bins for the first bin plane;
- weighting the first value for the first class of bins by a first weight to generate a weighted first value and weighting the second value for the second class of bins by a second weight to generate a weighted second value;
- selecting a third value for a second bin plane; and
- selecting a context model based on the first weighted value, the second weighted value, and the third value.

* * * * *